United States Patent [19]

Bihuniak et al.

[11] 4,200,445
[45] Apr. 29, 1980

[54] METHOD OF DENSIFYING METAL OXIDES

[75] Inventors: Peter P. Bihuniak, Corning; Lewis H. Brandes, Campbell; Donald L. Guile, Horseheads, all of N.Y.

[73] Assignee: Corning Glass Works, Corning, N.Y.

[21] Appl. No.: 895,140

[22] Filed: Apr. 10, 1978

Related U.S. Application Data

[60] Continuation-in-part of Ser. No. 791,931, Apr. 28, 1977, abandoned, which is a division of Ser. No. 680,061, Apr. 26, 1976, Pat. No. 4,042,361.

[51] Int. Cl.$^2$ .................. C03B 23/20; C01B 33/32
[52] U.S. Cl. ............................................ 65/18; 65/21; 65/DIG. 14; 106/52; 423/332; 423/337
[58] Field of Search ............ 65/18, DIG. 14, DIG. 7, 65/21; 423/332, 337, 338; 106/52; 264/42, 63

[56] References Cited

U.S. PATENT DOCUMENTS

| 2,268,589 | 1/1942 | Heany ................................. 65/18 X |
| 3,244,639 | 4/1966 | Mindick et al. ................ 65/DIG. 14 |
| 3,678,144 | 7/1972 | Shoup ............................. 65/DIG. 14 |
| 3,759,683 | 9/1973 | Dislich et al. ................. 65/DIG. 14 |
| 3,799,754 | 3/1974 | Thomas .......................... 65/DIG. 14 |
| 3,847,583 | 11/1974 | Dislich et al. ................. 65/DIG. 14 |
| 3,867,156 | 2/1975 | Fukumato et al. ............ 65/DIG. 14 |
| 3,868,227 | 2/1975 | Gericke et al. ................ 65/DIG. 14 |
| 3,941,574 | 3/1976 | Melkonian et al. ..................... 65/27 |
| 4,042,361 | 8/1977 | Bihuniak et al. ......................... 65/18 |

Primary Examiner—S. Leon Bashore
Assistant Examiner—Frank W. Miga
Attorney, Agent, or Firm—Clinton S. Janes, Jr.

[57] ABSTRACT

A method of densifying a fumed metal oxide is disclosed wherein the metal oxide is converted to a flowable sol and then dried to form a fragmented solid which is calcined. The calcined oxide may be wet milled to provide a slip for casting articles such as fused silica crucibles used in melting silicon. The method also permits the production of very refractory fused glass compositions from fumed metal oxides at temperatures substantially below those required where a melting step is employed.

3 Claims, No Drawings

METHOD OF DENSIFYING METAL OXIDES

This application is a continuation-in-part of Ser. No. 791,931, filed Apr. 28, 1977, now abandoned, which, in turn, was a division of Ser. No. 680,061, filed Apr. 26, 1976, now U.S. Pat. No. 4,042,361.

BACKGROUND OF THE INVENTION

This invention relates to a method of densifying fumed metal oxides, and to the use of such densified oxides in forming slip cast articles.

A "fumed" metal oxide is a finely divided material, such as silica, that may be prepared by either a vapor phase oxidation or a combustion process. In a typical vapor phase process, vapors of a metal compound, such as silicon tetrachloride ($SiCl_4$), are thermally converted in the presence of moisture to the corresponding oxide, e.g. silica. In a combustion process, a combustible metal compound, such as a silicon halide or halosilane, is burned to produce the oxide. The former process is described, for example, in U.S. Pat. No. 2,272,342 granted Feb. 10, 1942 to J. F. Hyde, and No. 2,268,589, granted Jan. 6, 1942 to J. A. Heany. The latter process is described, for example, in U.S. Pat. No. 2,823,982, granted Feb. 18, 1958 to O. Saladin et al.

The oxides thus obtained are conventionally finely divided, low density, fluffy materials characteristically having an average particle size in the range of 10 to 50 millimicrons and a surface area in the range of 100 to 400 $m^2$/gram. Typically, the particles are agglomerated in clusters reminiscent of grape clusters. Fumed $SiO_2$, fumed $TiO_2$, and fumed $Al_2O_3$ of high purity are available commercially. Such oxide materials are widely used as additives in paints, rubber products, and other organic materials.

It has been recognized that such fumed oxides are highly active, and that glass-forming oxides can be consolidated to solid glass bodies below normal melting temperatures. The processes mentioned provide convenient means of obtaining high purity glass components by starting with high purity materials. Thus, the purity of the component, and hence the glass, is dependent on the purity of the materials processed. High purity glasses may be defined as containing no more than ten parts per million (ppm) alkali metal ions, less than one ppm transition metal ions, and less than twenty ppm total metal impurities, that is, metals exclusive of any intentionally added dopants.

One need for such high purity glasses occurs in melting crucibles used by the semiconductor industry. In particular, high purity silica crucibles are desired for melting and drawing silicon. Such crucibles may be produced by silica deposition on a mandrel to form a preform, followed by thermal consolidation of the preform as described, for example, in U.S. Pat. No. 3,741,796, granted June 26, 1973 to Jack Walker. Alternatively, such crucibles have been produced by comminuting fused quartz, suspending the particles in a casting medium, and forming the crucible in a plaster mold by conventional slip casting practice. This procedure, while widely practiced, has the drawback that most quartz raw materials do not meet high purity standards without purification, as by leaching.

It would therefore be desirable to use fumed oxides, especially fumed silica, to form shaped bodies such as crucibles. However, it is very difficult to form clear, homogeneous bodies by vitrification of green bodies compressed from these fluffy materials by ordinary pressing or pelletizing techniques. Furthermore, they do not lend themselves, in their low density form, to mixing with the vehicles normally used for slip casting. It is therefore a primary purpose of this invention to circumvent these problems by providing a method of densifying fumed metal oxides, especially silica, whereby such oxides can be successfully employed in the production of hot pressed or slip cast articles, as well as for other purposes.

PRIOR ART

In addition to art already mentioned, U.S. Pat. No. 3,762,936, granted Oct. 2, 1973 to R. K. Iler, discloses use of a mechanical mixer to form a slurry or suspension of silica-boric oxide mixtures, and U.S. Pat. No. 3,799,754, granted Mar. 26, 1974 to Ian M. Thomas, discloses drying and calcining a gel material to produce a lead borosilicate glass precursor which melts below 860° C. With respect to use of a typical fumed silica, the Iler patent discloses that, while such material is suitable, it is less practical than other materials disclosed for the purposes of the patentee.

SUMMARY OF THE INVENTION

Our invention then is a method of densifying a fumed metal oxide which consists of mixing the oxide with a polar liquid to form a flowable colloidal suspension in the nature of a sol, delivering the sol from a container in a flowable state, drying the sol to form a fragmented solid, and thereafter calcining the fragmented solid to densify the fragments. In a preferred embodiment, the oxide is fumed silica and the solid silica fragments that form on drying are calcined within the temperature range of 1150° C. to 1500° C. In accordance with another facet of the invention, such silica, or other oxide, may be milled to an appropriate size, suspended in a known casting medium, and slip cast in a mold to produce a crucible shape that is then consolidated to a high purity oxide crucible, such as the familiar silica crucible used for silicon wafer production. Where desired, mixtures of fumed metal oxides can be subjected to the inventive process and consolidated into a vitreous body. Finally, glasses of various compositions can be devised by dissolving or otherwise incorporating ingredients into the polar liquid or adding fillers to the precursor sol.

GENERAL DESCRIPTION

Fumed metal oxides may be produced by known procedures including the vapor phase and combustion procedures referred to earlier. Silica is, of course, the oxide of present commercial significance, and hence the invention is described with reference to that oxide. However, it will be appreciated that various metal oxides, particularly those of Groups III and IV metals, are amenable to the procedure of the present invention, and that such oxides may be employed in combination as well as singly. Specifically, an alumina-doped silica is of particular interest.

Also, very refractory, high silica (>70% and, preferably, >80% by weight $SiO_2$) glasses containing metal oxides from Groups III and IV of the Periodic Table such as, for example, $Al_2O_3$, $B_2O_3$, $GeO_2$, $HfO_2$, $TiO_2$, and $ZrO_2$, are of particular interest. The present inventive method permits the production of such glasses utilizing temperatures significantly lower than are required in the conventional melting of such glasses, i.e., temperatures less than about 1500° C. The method also permits the addition of such conventional glass constituents as the alkali metal and alkaline earth metal oxides.

Referring specifically to fumed silica, we have successfully used material collected as a porous preformed shape and then crushed. This material has a surface area of about 50 m²/gram and approaches the maximum particle size that can be readily suspended for subsequent operations. In general, fumed silica having a surface area greater than 500 m²/gram is not available and would present dusting and other handling problems in any event. Accordingly, we prefer materials with a surface area in the range of 100 to 400 m²/gram.

The fumed oxide may be mixed with any readily available polar liquid. Water is, of course, the liquid normally chosen, but other polar liquids such as the simple alcohols, might be employed if desired. In mixing, the liquid may be added to the powder, or vice versa, as desired. In any case, we prefer to use a closed mixer to avoid dusting. This permits the liquid to be added prior to mixing, or, in part at least, as a spray during mixing.

If a dry material such as fumed silica is added to water, the two may be manually mixed until the suspension becomes too stiff to permit further addition. By this procedure, we find that a maximum content of about 10 to 12% solids may be incorporated in an aqueous suspension.

Alternatively, the total solids content, as predetermined, is added to a conventional mixer, such as a paddle or sigma blade type mixer. The water may then be added in total, or over a period of several minutes during mixing. Initially, the solid silica powder appears as a damp powder. Suddenly, however, as the air is worked out and the silica becomes thoroughly wetted, the mix, rather than granulating, forms a thin fluid mass of pale milky color which has a viscosity on the order of a few hundred centipoises and which is readily flowable.

The amount of solids added by this alternative form of mechanical mixing depends on the nature and speed of the mixing. We find that, with what is known as a high shear type mixer, we can incorporate up to about 45% solids. However, such a maximum solids suspension begins to set up very quickly. Accordingly, we generally prefer to add a maximum of approximately 30% solids.

The colloidal suspension (sol) thus prepared must now be completely dried. As the suspending medium, usually water, is removed, the sol tends to first stiffen and then become rigid. It also shrinks and breaks into chunks or fragments as it dries. It will be appreciated that the higher the solids content in the sol, the less liquid that most subsequently be removed.

It is, however, a key feature of the invention that a fumed oxide is dispersed in a liquid to form a flowable sol, and that such sol is delivered from a mixer or other container in a freely flowable form preparatory to drying. While the viscosity may become as great as about 3,000 centipoises without totally impairing flowability, such flow will be very slow. Accordingly, in order to achieve the optimum benefits of the present invention, as hereafter described, we prefer to bring a sol to a viscosity below about one thousand centipoises for pouring.

There is a tendency for the viscosity of a sol to increase, on standing, from the usual as-mixed value of 200 to 300 centipoises up to a point where the sol sets and can not be poured. Hence, if a sol must be held for a length of time before further processing, some provision may be necessary for either extending shelf life, or for redispersal. Thus, it has been found that a sol that has set up can again be rendered flowable by remixing.

We have found that prolonged mixing time, either initially or after a suspension has set up, will reduce the viscosity and lengthen the time required to set, that is, extend shelf life, providing other factors are maintained constant. Among such other factors, a very important one is temperature of the suspension. Thus, raising the temperature of a mix from 25° C. to 60° C. may reduce set time from several minutes to several seconds. Accordingly, if any appreciable mixing time is employed, the material must be cooled because an appreciable part of the shear energy is dissipated as heat. It is our belief that viscosity in a given sol is a function of the degree of polymerization which, in turn, is dependent on temperature, degree of shear, and time.

It is known that silica gels tend to shrink in size and break into rather large chunks on drying. We find that such chunks, after calcining, are undesirable for slip casting purposes because of the milling time required to reduce them to casting size. In general, the average particle size of silica should be in a range of one to ten microns for conventional slip casting. This size range is roughly equivalent to a surface area of one to two m²/gram.

We have found that it is most advantageous to have fragmented particles not over about one quarter inch in cross-section, and preferably about one eighth inch, for milling. We have further found, quite surprisingly, that the fragment size produced by drying may be dependent on the cross-section of the body being dried. Thus, if a sol is poured out onto a two foot square drying sheet to a depth of about one eighth inch, then the sol will shrink as it dries and tend to dice or fragment into a multitude of small particles about one eighth inch across. These may then be calcined to provide optimum size particles for grinding.

The preferred drying technique is to expose the sol to drying conditions in a form having a cross-section not over one eighth inch, and to maintain such limited cross-sectional dimension during drying, or at least until the sol becomes rigid and separates into particles. This technique may be carried out in a variety of different ways. Thus, the sol may flow through one or more small orifices, preferably under pressure, to produce elongated streams in the nature of noodles or spaghetti which rigidify in such form and break into short cylindrical lengths if exposed to sudden heat as they emerge from the forming orifices.

An alternative procedure is to spread the sol over a heated casting table or plate to a desired depth, say an eighth inch or so. As the sol becomes heated, it loses liquid and becomes rigid. As the material shrinks due to liquid loss, it tends to dice into small pieces ready for calcining. For a continuous process, the sol may be delivered onto an endless moving belt which may be heated as by passing through a tunnel heater or over a heat source. The diced material may then be collected in calcining trays off the belt as it passes over a roller to reverse its path.

The rate of heating may be varied considerably. Preferably, the material in the liquid state is maintained below its boiling point to avoid splashing and/or drying of the material in chunk form. The material must be rigidified and diced in this drying, but need not be completely dried. Thus, final moisture removal may come during the subsequent calcining if desired.

The diced material, produced by drying as described above, is now calcined to densify it preparatory to grinding. This may be carried out in any conventional heat treating furnace, although we prefer to use an electrically heated unit to reduce residual water content in the calcined material. The calcining treatment requires a maximum temperature in the range of 1150° C. to 1500° C. with the time ranging from about ten minutes at high temperatures to an hour at low temperatures.

The densified material thus produced can then be shaped into articles of desired geometry utilizing fabrication techniques conventional in the ceramic art such as pressing, extrusion, slip casting, etc. Where pressing or extrusion comprises the forming method, the calcined material will be ground and screened to the proper range of particle sizes required for the particular method involved, blended with a liquid vehicle and, optionally, a temporary bonding agent, lubricant, and/or pressing aid, and thereafter pressed or extruded in the customary manner. The body can then be fired in known manner, normally at temperatures below 1500° C., to yield the desired end product.

Where the forming method to be employed contemplates slip casting, it is customary to ball mill the densified material in a liquid until the average particle size is in the range of one-to-ten microns. To insure powdered material of the highest purity, the walls of the ball mill will be plastic lined and the balls will be composed of the same composition as that of the powdered material. For example, where a final product of fused silica is desired, the balls will be composed of high purity fused silica.

The milled powder is suspended in a suitable casting medium and poured into casting molds in conventional manner. The cast body is then fired in known manner to produce the desired end product. In the case of a silica crucible, the maximum firing temperature is in the range of 1700° C. to 1800° C., and the fired body is a vitreous silica crucible.

SPECIFIC DESCRIPTION

The invention is further described with reference to specific embodiments, it being understood that these merely illustrate various facets, rather than limit the scope, of the invention.

The examples given below describe the inventive method as applied to densification of fumed silica with or without dopants, it being within the skill of the art then to ascertain any specific modifications necessary to extend such practices to other suitable oxides.

As indicated above, there are various sources of fumed silica. Our work has largely involved materials available from the Cabot Corporation, Boston, Mass., U.S.A., two particularly useful materials being Cab-O-Sil® MS-7 and EH-5. These materials are very light and fluffy, and are technically characterized by their surface area and by their bulk density. The material identified as MS-7 has a specific surface area of about 200 $m^2$/gram and a bulk density of about four (4) lbs./cu. ft.; that identified as EH-5 has a specific surface area of 400 $m^2$/gram and a bulk density of two (2) lbs./cu. ft.

EXAMPLE 1

A suspension or sol of MS-7 fumed silica and water was produced by mixing 400 grams of silica with 3100 grams of water to form a sol containing 11 to 12% solids. The water was placed in a fused silica container to insure purity retention, and silica was added while manually stirring with a plastic spatula over a period of about twenty (20) minutes. This represented about the maximum amount of silica that could be suspended by manual mixing to produce a flowable sol.

The crucible was covered and placed in a drying oven at 125° C. for a period of 36 to 48 hours to completely remove the water. The thus dried material had broken up into irregular pieces varying from about a millimeter to several centimeters in cross-section. The crucible and its contents were then placed in a calcining chamber for a half hour at 1250° C. to densify the particles. The calcined material was then placed in a ball mill for crushing to an 8 to 10 micron average particle size for slip casting. It was observed that there was a tendency for the larger chunks to act as crushing media and not be broken up. Thus, while casting material could be produced, the yield was low.

As an aid in mixing, the procedure above was repeated except that, once the silica was dampened, a portable electric mixer was used. This lessened the mixing time to about 15 minutes with no appreciable change in the resulting sol. However, it was still difficult to avoid variations in viscosity through the sol, presumably due to incomplete breakup of the silica clusters or clumps in the fumed material.

EXAMPLE 2

The procedure was modified in this case to use mechanical mixing, the mixer being a commercial food mixer of the paddle type having a four quart capacity. Three hundred (300) grams of the MS-7 fumed silica were placed in the mixing bowl and water was added as a spray during mixing. A low speed was used initially to avoid dusting, and the speed was increased as the material dampened. Mixing was continued for five to six minutes and a total of 770 grams water was introduced to provide a sol containing 28% solids. This was poured into a drying tray to a depth of one to two inches and dried overnight. The chunky material thus produced was crushed to pass through a 4 mesh screen and the crushed material calcined in a fused silica crucible for 30 minutes at a temperature of 1350° C. The calcined material was then wet milled to provide material of 8 to 10 micron average particle size in a casting slip.

As a modification, larger batches were prepared as described above except for use of a twenty (20) quart size mixer bowl. No difference in material properties was observed in the change from the small batch of the four quart mixer to the larger batch of the twenty quart mixer.

EXAMPLE 3

In this example, the sol was prepared in a closed bowl mixer known as a high shear mixer. The mixer is of the type described in U.S. Pat. No. 2,945,634 issued July 19, 1960 to Henschel-Werke Gesellschaft, and characteristically embodies two sets of flat blades vertically spaced and set at right angles to each other.

Sixteen hundred ten (1610) grams of MS-7 fumed silica were combined with 3750 grams of water in the mixer to produce a suspension containing about 30% solids. The silica was predampened by hand mixing with water to reduce its fluffy nature and thus enable mixing a larger batch at one time. The dampened silica was placed in the mixer and the mixer rotated at 1800 rpm for 30 seconds. At this point the material suddenly became a flowable suspension, as indicated by a sudden decrease in power to operate the mixer. Normally, the batch is mixed for a full minute to render the suspension viscosity more uniform as well as to thoroughly disperse any additive or dopant that is present.

The suspension, having a viscosity on the order of a few hundred centipoises, was poured onto drying trays. Each tray had a peripheral barrier about ⅛ inch thick within which was provided about two (2) square feet of flat surface. The tray was filled with suspension and set over a flat, radiant industrial heater of approximately the same surface geometry as the tray. The heater was electrically powered and was regulated to heat the suspension just below boiling.

As the water was removed, the pool of silica sol gradually rigidified and fragmented into a pattern resembling cracks in a dried mud flat. Further drying caused the rigid material to dice into relatively uniform size particles about ⅛" in cross section.

The ⅛" particle size has been found particularly suitable for subsequent milling to form a casting slip. Prior to grinding, however, the granules are calcined for 30 minutes at 1350° C.

EXAMPLE 4

A sol was prepared as in Example 3, and a small portion was taken out in a glass tube constricted to provide approximately a ⅛" orifice. The sol was delivered manually from this tube onto a plate in a sinuous, continuous stream, and the plate dried for 5–10 minutes in an oven operating at 110° C. The sol rigidified as before and separated into short lengths which, on further drying, produced ⅛" cylindrical particles otherwise similar to those produced by drying a continuous layer.

It was apparent that, instead of being collected on a plate, the stream could be passed between heated surfaces to dry and dice in like manner.

EXAMPLE 5

A silica sol was prepared in the same manner as in Example 3, except that sufficient finely-divided elemental silicon to provide 500 parts per million in the ultimate casting glass was added in conjunction with the fumed silica. The function of such additive is described in application Ser. No. 680,459, now U.S. Pat. No. 4,033,780, filed by P. P. Bihuniak and C. E. Baumgartner of even date with Ser. No. 680,061, now U.S. Pat. No. 4,042,361.

The sol as it dried was homogeneously colored a brownish gray, indicating that the silicon was uniformly dispersed therein. The batch was mixed in the high shear mixer for a full minute to insure uniform dispersal.

EXAMPLE 6

An experiment was designed to study the effect of temperature on setting time, a time arbitrarily taken as that required to reach a viscosity of 1000 centipoises, and also the effect of redispersal on this time. A batch was prepared as in Example 3 and two aliquots removed. The amount of silica incorporated was increased to provide about 34% solids.

Each sample of the sol was allowed to stand in air until it reached a viscosity of 1000 centipoises. Then a channeled dispersing rod was introduced and rotated for a short time under controlled temperature conditions to redisperse the sol. This procedure was repeated several times and the time required to reach 1000 centipoises was measured each time. The data observed are set forth below:

| Uncooled | | Cooled | |
| --- | --- | --- | --- |
| Dispersal Time and Temp. | Set time (min.) | Dispersal time and temp. | Set Time (min.) |
| As mixed | 4 ½ | As mixed | 4 |
| 5 min. at 27° C. | 4 ¾ | 3 min. at 25° C. | 13 |
| 5 min. at 35° C. | 8 | 8 min. at 27° C. | 17 |
| 5 min. at 37° C. | 11 | 6 min. at 23° C. | 35 |
| | | 3 min. at 19° C. | 70+ |

These data demonstrate that the shelf life of a batch is greatly increased by extended dispersal, provided temperature control is observed. However, even small temperature increases, such as occur in high shear mixing, can sharply reduce the setting time of a batch. Thus, it is estimated that a 30% solids batch mixed under controlled cooling conditions has a shelf life of about twenty (20) minutes, as compared to the 4 to 5 minutes indicated for an uncooled mix.

To illustrate the capability of the inventive method for producing glasses of various compositions, the succeeding work was undertaken. The basic concept involved the preparation of high silica glasses (>70% by weight $SiO_2$) wherein the silica ingredient would be fumed silica. Other oxides, preferably chosen from the Groups III and IV metals of the Periodic Table, such as $TiO_2$, $GeO_2$, and $Al_2O_3$, can be incorporated as fumed materials or in the form of very fine powders either as the oxides, themselves, or as compounds which, when fused, will be converted to the desired oxide in the proper proportions. The use of fumed materials exclusively can provide more uniform mixing and increased reaction between the materials than is normally possible where fine particles are mixed with fumed oxides. Thus, greater homogeneity of final product is frequently obtained. Components which are soluble in the polar liquid utilized to produce the sol can also be incorporated into the final product. For example, $B_2O_3$, $CaO$, $K_2O$, $Na_2O$, $ZrO_2$, $HfO_2$, and the like, can be included in the glass composition by dissolving the oxides or other compounds thereof such as $H_3BO_3$, $KOH$, $CaCl_2$, $ZrCl_4$, $HfCl_4$, and $NaOH$ in water. Mixing of the components will produce a gel as a result of the properties of fumed silica. The gel can then be dried, calcined to a homogeneous glass, milled, and then reformed into a shape by, for example, slip casting or, if a glaze is desired on a substrate, a slip can be sprayed thereupon.

The most ideal approach for yielding glasses of unparalled homogeneity utilizes a single, multi-component, fumed precursor material. Hence, all of the components will be passed through a flame burner such that a composite fumed product of uniform composition is produced. For example, a silica-producing and a Group III and/or Group IV metal oxide-producing component are passed through a flame burner to form a composite fumed product of uniform composition. The resulting composite fume is used in the gel process and yields the most uniform and homogeneous glass after calcining. The calcined material can thereafter be ground and further processed into shapes or utilized as a glaze frit.

EXAMPLE 7

Analyses of two glass compositions, expressed in weight percent on the oxide basis, are set out below. The first was prepared via the inventive gel process whereas the second was produced utilizing conventional glass melting, but at 1800° C. in a platinum crucible.

|  | Gel | Melt |
|---|---|---|
| $SiO_2$ | 86.9 | 87.4 |
| $K_2O$ | 1.05 | 1.04 |
| $Al_2O_3$ | 5.7 | 5.3 |
| $B_2O_3$ | 6.41 | 6.54 |

The target glass had the following composition, also expressed in weight percent on the oxide basis:

|  |  |
|---|---|
| $SiO_2$ | 88 |
| $K_2O$ | 1 |
| $Al_2O_3$ | 4 |
| $B_2O_3$ | 7 |

In preparing 5000 grams of the glass via the gel technique, the general procedure outlined above in Example 2 was employed utilizing a commercial food mixer of the paddle type having a twenty quart capacity. Fumed silica and fumed alumina in the proper calculated quantities were placed in the mixing bowl. KOH and $B_2O_3$ were dissolved in water at room temperature in the proper amounts calculated to yield the desired final content in the glass. This solution was added as a spray during the mixing cycle. Mixing was initiated at a low speed to inhibit dusting of the fumed material but, as the material became dampened, the speed of mixing could and was increased. Sufficient solution was added and the mixing compound for about five to six minutes to produce a sol containing approximately 30% solids. The suspension was poured onto the drying trays described above in Example 3.

The water was removed by heating the suspension just below boiling. The drying was continued until the material diced into relatively uniformly-sized particles about ⅛" in cross section. As was observed above in Example 3, granules of these dimensions are especially suitable for subsequent milling to form a casting slip. However, prior to milling, the dried gel was calcined for 30 minutes at 1300° C. to yield glassy granules. A cast slip can be fired to a solid body at temperatures not in excess of about 1300° C.

The glass melted at 1800° C. could not be readily poured and resulted in a large chunk that required primary crushing prior to ball milling. In contrast, the gel produced glass in the form of granules ready for milling, and at a temperature far below that demanded for melting. In large scale production volume, the melting practice would be well nigh impossible to carry out plus the added economic disadvantage of the tremendous amount of energy required during the melting step.

The minor differences in glass analyses noted between that produced through the inventive gel process and that resulting through melting are not deemed sufficient to significantly affect the properties of the glass or its application.

EXAMPLE 8

Glasses having the following compositions, reported in weight percent on the oxide basis, were prepared utilizing the general method steps of Example 7 with a paddle type mixer having a twenty quart capacity.

|  | A | B | C | D | E | F |
|---|---|---|---|---|---|---|
| $SiO_2$ | 88.8 | 86.9 | 85.9 | 84.9 | 83.4 | 82.4 |
| $TiO_2$ | 9.2 | 10.1 | 10.1 | 10.1 | 10.1 | 10.1 |
| $B_2O_3$ | 2.0 | 3.0 | 4.0 | 5.0 | 5.0 | 6.0 |
| CoO | — | — | — | — | 1.5 | 1.5 |

Fumed silica and finely-ground $TiO_2$ powder (passing a 325 U.S. Standard Sieve) in the proper calculated quantities were deposited into the mixing bowl. $B_2O_3$ and $Co(NO_3)_2.6H_2O$ were dissolved in water at room temperature in the amounts calculated to yield the desired final content in the glass. CoO is relatively insoluble in water. The mixing procedure similar to that described in Example 7 was followed to produce a sol containing about 30% solids. Drying of the suspension was likewise undertaken in accordance with the practice outlined in Example 7. The resulting granules were calcined at 1300° C. which, when subsequently milled, could be slip cast and fired to a solid glass body at temperatures no higher than 1300° C.

The above glasses have coefficients of thermal expansion approximating or somewhat below that of fused silica ($5 \times 10^{-7}$/°C. over the temperature range of 0°–300° C.), thereby permitting neutral or compression seals to be made between the two materials. And, by carefully controlling the amounts of $B_2O_3$ and $TiO_2$ included in the composition, it is possible to reduce the softening point of the glass while maintaining the coefficient of thermal expansion at a predetermined value. For example, composition E above has a softening point about 250° C. lower than that of fused silica and composition F about 280° C. lower. Yet, the coefficient of thermal expansion of those two glasses is about $5 \times 10^{-7}$/°C.

This capability of the glasses has recommended their utility as glazes for porous silica insulating tile and cordierite heat exchanger elements. Hence, because the softening points of the glasses are lower than those of fused silica and cordierite, the firing of frits of those compositions to impervious coatings without deforming the substrate is very possible. For example, frits of composition F will fire to an impervious coating at 1260° C.

Cobalt oxide is present in the above compositions to perform as an emissivity agent.

Microscopic examination of the above glasses evidenced some inhomogeneity therein. One explanation for this phenomenon is believed to involve the use of powdered $TiO_2$ rather than fumed $TiO_2$. It is surmised that the $TiO_2$ grains may not react completely because of the relatively large particle size when compared with the fumed silica. Hence, the effectiveness of the low consolidation temperatures employed to yield a homogeneous glass depends upon the high reactivity of the components. The reactivity of the fumed $TiO_2$ is substantially greater than that of the powdered material. Also, it has been hypothesized that the $B_2O_3$ may concentrate on the surface of the gel during the drying of the sol, thereby giving rise to a $B_2O_3$ gradient. It will be recognized that such inhomogeneity will be avoided where a single, multi-component fumed material incorporating the complete composition, as was described above, is utilized as the starting material.

EXAMPLE 9

Glasses having the following approximate compositions, expressed in weight percent on the oxide basis, were prepared utilizing the general method steps of Example 7 with a paddle type mixer.

|  | G | H |
|---|---|---|
| $SiO_2$ | 96 | 94 |
| $ZrO_2$ | 4 | — |
| $HfO_2$ | — | 6 |

Fumed silica in the necessary calculated amounts was dispensed into the mixing bowl. $ZrCl_4$ and $HfCl_4$ were dissolved in water at room temperature in the quantities determined to yield the desired final content in the glass. The mixing procedure similar to that described in Example 7 was followed to produce a sol containing about 30% solids. Drying of the suspension was likewise conducted in the manner set out in Example 7. The resulting granules were calcined at 1300°–1400° C.

EXAMPLE 10

A glass consisting of about 70% high purity $SiO_2$ and 30% high purity $GeO_2$ was produced following the general practice of Example 7 with a paddle type mixer. High purity $GeCl_4$ was first dissolved in water and the solution then fired in an autoclave at about 300° C. $GeO_2$ powder resulted therefrom which was relatively water-insoluble. Fumed silica and this $GeO_2$ powder were deposited into the mixing bowl in the proper calculated proportions. Mixing was accomplished in a manner like unto that described in Example 7 to yield a sol containing about 30% solids. The method for drying the suspension was also similar to that outlined in Example 7. The granules produced were calcined at about 1300° C.

As was the case in Example 8 with the use of powdered $TiO_2$, microscopic examination of the glasses prepared by firing the granules showed some inhomogeneity therein. The mechanism underlying this phenomenon is believed to be the same as that operating in Example 8.

EXAMPLE 11

The production of extremely pure mullite ($3Al_2O_3 \cdot 2SiO_2$) was undertaken utilizing the procedure generally described in Example 2 using a paddle type mixer having a four quart capacity. Thus, fumed silica and fumed alumina in the necessary calculated amounts were deposited into the mixing bowl and water was added as a spray during mixing in a sufficient amount to provide a sol containing about 30% solids. The suspension was dried on trays to cause dicing into granules having a cross section of about ⅛". After calcining at about 1350° C., X-ray diffraction analysis of the material evidenced a very clean mullite pattern.

We claim:

1. A method for producing glassy granules of high silica glass (>70% by weight $SiO_2$) containing at least one metal oxide from Groups III and IV of the Periodic Table selected from the group of $Al_2O_3$, $B_2O_3$, $GeO_2$, $HfO_2$, $ZrO_2$, and $TiO_2$ which consists of the steps:

(a) a silica-producing component and said Group III and/or Group IV metal oxide-producing component are passed through a flame burner to form a composite fumed product of uniform composition;

(b) said composite fumed product is mixed with a polar liquid to form a flowable sol containing up to 45% solids content;

(c) said polar liquid is removed from said sol to produce a fragmented solid; and then (d) said fragmented solid is calcined within the temperature range of 1150°–1500° C. to produce glassy granules.

2. A method according to claim 1 wherein said fragmented solid has a cross section of not over 0.25".

3. A method according to claim 1 wherein said polar liquid is water.

* * * * *